(12) United States Patent
Miyoshi et al.

(10) Patent No.: US 11,876,153 B2
(45) Date of Patent: Jan. 16, 2024

(54) LIGHT EMITTING APPARATUS AND PRODUCTION METHOD THEREOF

(71) Applicant: Nichia Corporation, Anan (JP)

(72) Inventors: Tomonori Miyoshi, Tokushima (JP); Kenji Ozeki, Katsuura-gun (JP); Tomoaki Tsuruha, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/181,962

(22) Filed: Mar. 10, 2023

(65) Prior Publication Data

US 2023/0207745 A1    Jun. 29, 2023

Related U.S. Application Data

(60) Continuation of application No. 16/920,243, filed on Jul. 2, 2020, now Pat. No. 11,626,543, which is a
(Continued)

(30) Foreign Application Priority Data

Oct. 29, 2010  (JP) ................................. 2010-243811
Oct. 29, 2010  (JP) ................................. 2010-243812

(51) Int. Cl.
*H01L 33/50* (2010.01)
*H01L 25/075* (2006.01)
(Continued)

(52) U.S. Cl.
CPC ........ *H01L 33/502* (2013.01); *H01L 25/0753* (2013.01); *H01L 27/156* (2013.01);
(Continued)

(58) Field of Classification Search
None
See application file for complete search history.

(56) References Cited

U.S. PATENT DOCUMENTS 6,392,294 B1    5/2002  Yamaguchi
8,476,657 B2    7/2013  Kawasaki et al.
(Continued)

FOREIGN PATENT DOCUMENTS

CN    101047222 A    10/2007
CN    101361200 A    2/2009
(Continued)

OTHER PUBLICATIONS

Extended European Search Report dated Mar. 4, 2014 issued in European Application No. 11186792.5.
(Continued)

*Primary Examiner* — Michelle Mandala
*Assistant Examiner* — Jordan M Klein
(74) *Attorney, Agent, or Firm* — Foley & Lardner LLP

(57) ABSTRACT

A light emitting apparatus includes: an electrically insulating base member having, in a top plan view, a first edge, a second edge opposite the first edge, a third edge, and a fourth edge opposite the third edge, wherein the first and second edges of the base member extend in a first direction, and the third and fourth edges of the base member extend in a second direction; first and second electrically conductive pattern portions formed on an upper surface of the base member; at least one light emitting device that is electrically connected to the first and second electrically conductive pattern portions; a transparent member disposed on the at least one light emitting device; and a resin portion that surrounds the transparent member in the top plan view, and that partially covers the first and second electrically conductive pattern portions.

18 Claims, 9 Drawing Sheets

Related U.S. Application Data continuation of application No. 14/988,319, filed on Jan. 5, 2016, now Pat. No. 10,741,729, which is a continuation of application No. 14/731,290, filed on Jun. 4, 2015, now Pat. No. 9,276,181, which is a continuation of application No. 14/275,331, filed on May 12, 2014, now Pat. No. 9,076,948, which is a division of application No. 13/283,415, filed on Oct. 27, 2011, now Pat. No. 8,759,124.

(51) Int. Cl.
　　　H01L 33/54　　(2010.01)
　　　H01L 33/62　　(2010.01)
　　　H01L 27/15　　(2006.01)
　　　H01L 33/48　　(2010.01)
　　　H01L 33/58　　(2010.01)
　　　H01L 33/56　　(2010.01)
　　　H01L 33/60　　(2010.01)
　　　H01L 33/64　　(2010.01)
　　　H01L 25/16　　(2023.01)

(52) U.S. Cl.
　　　CPC ............ *H01L 33/483* (2013.01); *H01L 33/54* (2013.01); *H01L 33/56* (2013.01); *H01L 33/58* (2013.01); *H01L 33/60* (2013.01); *H01L 33/62* (2013.01); *H01L 33/641* (2013.01); *H01L 25/167* (2013.01); *H01L 2224/16* (2013.01)

(56) References Cited

U.S. PATENT DOCUMENTS

| | | |
|---|---|---|
| 2004/0036079 A1 | 2/2004 | Nakada et al. |
| 2005/0248008 A1 | 11/2005 | Wilson |
| 2006/0138621 A1 | 6/2006 | Bogner et al. |
| 2007/0170454 A1 | 7/2007 | Andrews |
| 2007/0246731 A1 | 10/2007 | Isokawa et al. |
| 2008/0036362 A1 | 2/2008 | Tanimoto et al. |
| 2008/0185607 A1 | 8/2008 | Park |
| 2008/0246397 A1 | 10/2008 | Wang et al. |
| 2008/0291688 A1* | 11/2008 | Higashi ............... H01L 25/0753 362/545 |
| 2009/0001388 A1 | 1/2009 | Ishihara et al. |
| 2009/0021138 A1 | 1/2009 | Ogawa |
| 2009/0166657 A1 | 7/2009 | Yamada et al. |
| 2010/0320479 A1 | 12/2010 | Minato et al. |
| 2011/0254022 A1* | 10/2011 | Sasano ............... H01L 25/0753 257/E33.072 |
| 2011/0309388 A1 | 12/2011 | Ito et al. |
| 2012/0025218 A1 | 2/2012 | Ito et al. |
| 2012/0025243 A1 | 2/2012 | Lin |

FOREIGN PATENT DOCUMENTS

| | | |
|---|---|---|
| EP | 1 914 809 A1 | 4/2008 |
| JP | H05-029665 | 2/1993 |
| JP | H06-017259 U | 3/1994 |
| JP | H08-083869 | 3/1996 |
| JP | 2004-165308 A | 6/2004 |
| JP | 2006-324589 | 11/2006 |
| JP | 2007-019096 A | 1/2007 |
| JP | 2007-294867 A | 11/2007 |
| JP | 2008-041290 A | 2/2008 |
| JP | 2008-294181 A | 12/2008 |
| JP | 2009-182307 A | 8/2009 |
| JP | 2009-218274 A | 9/2009 |
| JP | 2009-238963 A | 10/2009 |
| JP | 2010-157638 A | 7/2010 |
| JP | 2010-219324 A | 9/2010 |
| WO | WO-2009/069671 A1 | 6/2009 |

OTHER PUBLICATIONS

Final Office Action in U.S. Appl. No. 14/988,319 dated May 3, 2019.
Final Office Action in U.S. Appl. No. 14/988,319 dated Oct. 18, 2017.
Non-Final Office Action in U.S. Appl. No. 14/988,319 dated Sep. 28, 2018.
Non-Final Office Action in U.S. Appl. No. 14/988,319 dated Nov. 6, 2019.
Notice of Allowance in U.S. Appl. No. 13/283,415 dated Feb. 3, 2014.
Notice of Allowance in U.S. Appl. No. 14/275,331 dated Mar. 5, 2015.
Notice of Allowance in U.S. Appl. No. 14/731,290 dated Oct. 7, 2015.
Notice of Allowance in U.S. Appl. No. 14/988,319 dated May 15, 2020.
Notice of Allowance in U.S. Appl. No. 16/920,243 dated Dec. 8, 2022.
Office Action dated Feb. 14, 2014 issued in Chinese Application No. 201110337731.1.
Office Action in JP Appln No. 2010-243811, dated Apr. 1, 2014.
Office Action in JP Appln No. 2010-243812 dated Apr. 1, 2014.
Office Action in U.S. Appl. No. 14/275,331 dated Nov. 5, 2014.
Office Action in U.S. Appl. No. 14/988,319 dated Dec. 30, 2016.
Office Action issued in Japanese Patent Application No. 2015-005017 dated Jul. 5, 2016.

* cited by examiner (a)

(b)

(c)

(a)

(b)

(c)

(a)

(b)

(c)

LIGHT EMITTING APPARATUS AND PRODUCTION METHOD THEREOF

CROSS-REFERENCE TO RELATED PATENT APPLICATIONS

This application is a Continuation of U.S. application Ser. No. 16/920,243, filed on Jul. 2, 2020, which is a Continuation of U.S. application Ser. No. 14/988,319, filed on Jan. 5, 2016 (now U.S. Pat. No. 10,741,729), which is a Continuation of U.S. application Ser. No. 14/731,290, filed Jun. 4, 2015 (now U.S. Pat. No. 9,276,181), which is a Continuation of U.S. application Ser. No. 14/275,331, filed May 12, 2014 (now U.S. Pat. No. 9,076,948), which is a Divisional of U.S. application Ser. No. 13/283,415, filed Oct. 27, 2011 (now U.S. Pat. No. 8,759,124), which claims priority under 35 U. S. C. § 119 to Japanese Patent Application Nos. 2010-243811 and 2010-243812, both filed on Oct. 29, 2010, the disclosures of which are hereby incorporated by reference in their entireties.

BACKGROUND OF THE INVENTION

1. Field of the Invention

The present invention relates to a light emitting apparatus that covers the side surface of a light emitting device with light reflective resin, and a method for producing this light emitting apparatus.

2. Description of the Related Art

Semiconductor light emitting elements such as light emitting diodes (LED) and laser diodes (LD) have been used in various types of light sources. In recent years, light emitting diodes have received attention as light sources for fluorescent lamps due to their long life and low power consumption. Further improvement of light emitting diodes is required in light output and light emission efficiency. Also, a light emitting diode light source is required which has high brightness and a particular light distribution (e.g., hemispherical light distribution also called Lambertian distribution) such as in the case of floodlights (e.g., car headlight). In order to control light distribution, a light emitting apparatus has been proposed in which the side surface of a light emitting device is covered with a light reflection member.

For example, Japanese Patent Laid-Open Publication No. JP 2007-19096 A discloses this type of light emitting apparatus 900. FIG. 12 is a cross-sectional view of this light emitting apparatus 900. The light emitting apparatus 900 is composed of an LED element 901, and a case 904 formed of ceramics on which the LED element 901 is mounted. The case 904 has an opening on the light output side. The LED element 901 is mounted in this opening. In addition, the opening of the case 904 is filled with a coating material 903 which contains light reflection particles. This coating material 903 covers the outside area of the LED element 901 except the light output surface.

In addition, a phosphor layer 902 is arranged on the external surface of the coating material 903, which is formed in the opening of the case and serves as the light output surface. The phosphor layer 902 is composed of resin including a phosphor such as YAG (Yttrium Aluminum Garnet) which is excited by light emitted from the LED element 901 (blue light) and emits wavelength-converted light (yellow light). The phosphor layer 902 is constructed covering the entire light output surface of the LED element 901. In addition, the phosphor layer 902 has a light emission surface which is exposed on the light output side. The primary light (blue light) from the LED element 901 is mixed with the secondary light (yellow light), which is emitted by wavelength conversion of a part of this primary light so that white light is output from the light emission surface.

WO 2009/069671 and Japanese Patent Laid-Open Publication No. JP 2009-218274 A disclose light emitting apparatuses which include light emitting device mounted on a flat plate member. FIG. 13 shows the light emitting apparatus 910 disclosed in WO 2009/069671. The light emitting apparatus 910 includes a transparent member 913 including a phosphor on the upper surfaces of the light emitting devices 912. The phosphor converts the wavelength of light emitted from the light emitting device 912. The side surfaces of the light emitting devices 912 and the transparent member 913 are covered with the light reflective material 914.

Also Japanese Patent Laid-Open Publication Nos. JP H05-29665 A and JP 2009-182307 A disclose light emitting apparatuses including a frame which is formed of white resin and surrounds a light emitting device, and a transparent sealing resin with which the inner area of the frame is filled.

As stated above, in the Japanese Patent Laid-Open Publication No. JP 2007-19096 A, WO 2009/069671, and the Japanese Patent Laid-Open Publications Nos. JP 2009-218274 A, JP H05-29665 A and JP 2009-182307 A, methods are proposed for forming the light reflective resin which covers the side surface of the light emitting device.

However, in the case of Japanese Patent Laid-Open Publication No. JP 2007-19096 A, to form the opening in the case formed of ceramics with high heat dissipation so that the opening is filled with the light reflective resin, a partial removing process or the like is required which removes a part of ceramic sheet to form the opening. In this case, the number of production process increases. In addition, the processing precision is not high in the process for forming the opening in ceramics. For this reason, the production yield may decrease, or the production cost may increase.

Also, in the methods of WO 2009/069671 and Japanese Patent Laid-Open Publication No. 2009-218274, although the light reflective resin is formed on the flat plate member without forming such an opening, the productivity is not sufficient. For example, in the case where a frame is formed of the same material as the plate member, and holds the light reflective resin in the frame, the production yield may decrease, or the production cost may increase similar to Japanese Patent Laid-Open Publication No. JP 2007-19096 A. Also, in the case where the light reflective resin is formed by using the frame and then removing the frame, a part of the light reflective resin may be peeled off from the plate member together with the frame when the frame is removed.

Also, in the cases of Japanese Patent Laid-Open Publication No. JP 2007-19096 A, WO 2009/069671, and the Japanese Patent Laid-Open Publications Nos. JP 2009-218274 A, JP H05-29665 A and JP 2009-182307 A, although the light emitting device is covered with white resin, or an electrically conductive pattern is formed which allows current to flow into the light emitting device covered with white resin, the electrical resistance is not sufficiently low, or the bonding strength between white resin and the plate member is not sufficient.

Thus, a need exists for new light emitting apparatuses that can provide increases bonding strength between the base member and the resin member while keeping electrical resistance low.

SUMMARY OF THE INVENTION

In one embodiment, a light emitting apparatus includes an electrically insulating base member, a pair of electrically conductive pattern portions, a light emitting device and a resin portion. The electrically insulating base member, and the pair of electrically conductive pattern portions are arranged on the base member. The light emitting device is electrically connected to the pair of electrically conductive pattern portions. The resin portion is arranged surrounding the light emitting device, and partially covers the pair of electrically conductive pattern portions. The pair of electrically conductive pattern portions extend toward the periphery of the base member from resin-covered parts of electrically conductive pattern portions that are covered with the resin portion. Elongated through holes are formed extending in the extending direction of the electrically conductive pattern portion in at least the resin-covered parts of the pair of electrically conductive pattern portions so that the surface of the base member is exposed in the through holes.

The through hole may be partially exposed from the resin-covered part. Each of the electrically conductive pattern portions may have two or more of the through holes. The through hole may have a substantially rectangular shape with the longer side extending along the extending direction of the electrically conductive pattern portion. The width of the pair of electrically conductive pattern portions may be larger than the width of the light emitting device. The base member may be a ceramic base member.

In another embodiment, a method for producing a light emitting apparatus includes an electrically conductive pattern portion forming step, a light emitting device connecting step, and a resin frame forming step. In the electrically conductive pattern portion forming step, a pair of electrically conductive pattern portions is formed on the base member. The electrically conductive pattern portions extend toward the periphery of the base member from light emitting device connecting parts. A light emitting device is connected to the light emitting device connecting parts. The light emitting device connecting parts have elongated through holes. The through holes extend in the extending direction of the electrically conductive pattern portion. Thus, the surface of the base member is exposed in the through holes. In the light emitting device connecting step, the light emitting device is electrically connected to the light emitting device connecting parts of the pair of electrically conductive pattern portions. In the resin frame forming step, a resin frame is formed that surrounds the light emitting device by discharging first resin in a line shape around the periphery of the light emitting device. The line-shaped first resin intersects with the through holes.

The method may further include a resin filling step for filling the inside area of the resin frame with second resin after the resin frame forming step. At least the light emitting device side parts of the through holes may be exposed from the first resin when the first resin is formed in the resin frame forming step. The first resin may be a light reflective resin. The second resin may be a light reflective resin with a lower viscosity than the first resin. The side surface of the light emitting device may be covered with the second resin in the resin filling step. The second resin may be a transparent resin.

In another embodiment, a light emitting apparatus includes a base member with an electric conduction pattern being formed on the surface of the base member and a resin member partially covering the base member. This arrangement can increase the bonding strength between the base member and the resin member and reduce the electrical resistance.

In another embodiment, a method for producing a light emitting apparatus includes a first light reflective resin forming step, a second light reflective resin filling step, and a resin curing step. In the first light reflective resin forming step, a first light reflective resin is formed in a frame shape surrounding the light emitting device on a base member. A light emitting device is mounted on the base member. In the second light reflective resin filling step, the space between the first light reflective resin and the light emitting device is filled with a second light reflective resin. The second light reflective resin has a lower viscosity than the first light reflective resin. The side surface of the light emitting device is covered with the second light reflective resin. In the resin curing step, the first light reflective resin and the second light reflective resin are cured after the second light reflective resin filling step.

The first light reflective resin and the second light reflective resin may be formed of the same resin material. The height of the first light reflective resin may be substantially the same as or lower than the upper surface of the light emitting device when the first light reflective resin is formed in the first light reflective resin forming step. The upper surface of the light emitting device may be exposed from the second light reflective resin when the space is filled with the second light reflective resin in the second light reflective resin filling step. A transparent member may be arranged on the light emitting device. The side surfaces of the light emitting device and the transparent member may be covered with the second light reflective resin and the upper surface of the transparent member may be exposed from the second light reflective resin when said space is filled with the second light reflective resin in the second light reflective resin filling step. The height of the first light reflective resin may be substantially the same as or lower than the upper surface of the transparent member when the first light reflective resin is formed in the first light reflective resin forming step. The transparent member may include a phosphor. The first light reflective resin and the second light reflective resin may be formed of a base material of transparent resin, and particles that are distributed in the base material and may have a refractive index different from the base material. The base material of the first light reflective resin may be silicone resin. The base material of the second light reflective resin may be silicone resin that has a viscosity lower than the base material of the first light reflective resin. The particles may be oxide particles that include at least one element selected from the group consisting of Ti, Zr, Nb, Al and Si, or are AlN or MgF.

An advantage of certain embodiments is that, because the first light reflective resin and the second light reflective resin are cured after the space between the first light reflective resin and the light emitting device is filled with second light reflective resin, the first light reflective resin and second light reflective resin may be integral. Accordingly, the bonding strength may be improved between first light reflective resin and the second light reflective resin. Also, the bonding strength may be improved between the first light reflective resin or the second light reflective resin, and the base member. Thus, it is possible to prevent components of the light emitting apparatus from peeling off of one another. Therefore, it is possible to provide a method for producing a light emitting apparatus which has improved reliability and can be inexpensively produced.

The above and further objects of the present invention as well as the features thereof will become more apparent from the following detailed description and the accompanying drawings.

DETAILED DESCRIPTION

Figure 1:
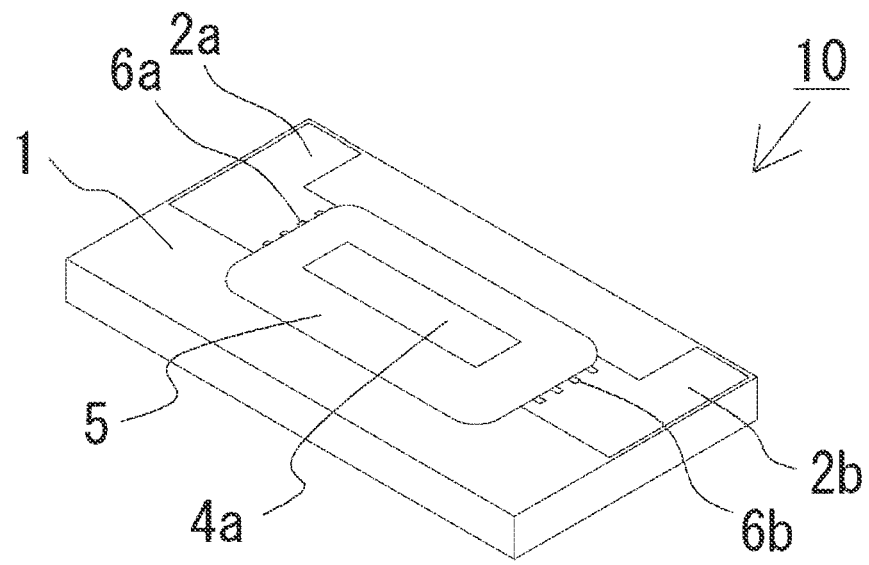
FIG. 1 is a perspective view schematically showing a light emitting apparatus according to a first embodiment.

The following description will describe embodiments according to the present invention with reference to the drawings. The drawings schematically show the embodiments. The arrangement, size, ratio, shape, and the like of members shown in the drawings are occasionally shown larger for ease of explanation. In the following embodiments, components in one embodiment having the same reference numerals as those of another embodiment represent substantially the same member or members corresponding to those of the other embodiment, and their description is occasionally omitted.

In this specification, terms "upper (upward)" and "lower (downward)" occasionally refer to a light output side and a side opposite to the light output side of a light emitting apparatus. For example, the term "upward" refers to the light output direction, i.e., the direction that light is emitted from the light emitting apparatus. The term "downward" refers to the direction opposite to this light output direction. Also, the term "upper surface" refers to a surface which is located on the light output side of a light emitting apparatus. The term "lower surface" refers to the surface opposite to this light output surface.

1. First Embodiment

Figure 2:
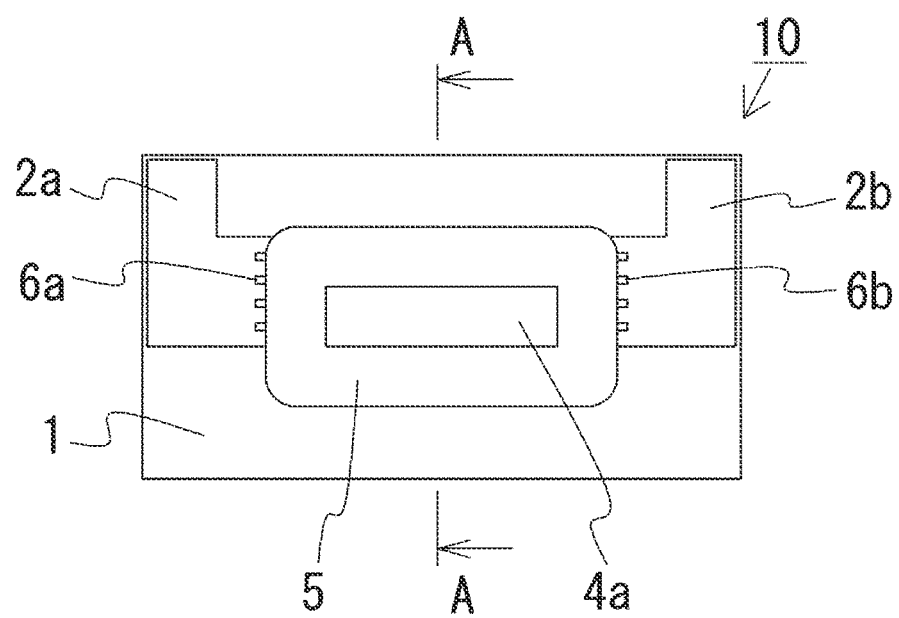
FIG. 2 is a plan view schematically showing the light emitting apparatus according to the first embodiment.
Figure 3:
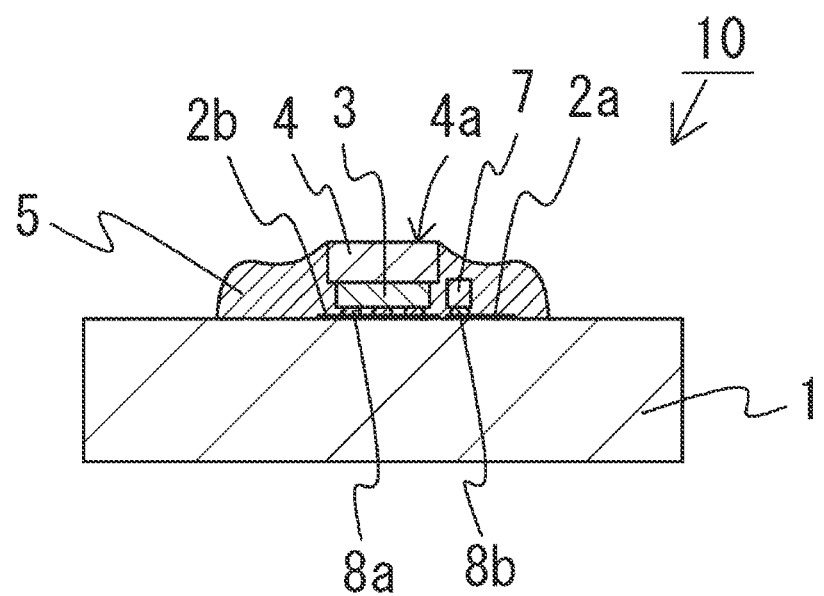
FIG. 3 is a cross-sectional view schematically showing the light emitting apparatus taken along the line A-A in FIG. 2.

FIGS. 1 to 3 are schematic views showing a light emitting apparatus 10 according to a first embodiment of the present invention. FIG. 1 is a schematic perspective view of the light emitting apparatus. FIG. 2 is a schematic plan view of the light emitting apparatus. FIG. 3 is a schematic cross-sectional view of the light emitting apparatus taken along in the A-A line in FIG. 2. The light emitting apparatus 10 includes a base member 1, light emitting devices 3, a transparent member 4 and a light reflective resin portion 5. The light emitting devices 3, the transparent member 4 and the light reflective resin portion 5 are arranged on the base member 1. The transparent member 4 is arranged on the upper surfaces of the light emitting devices 3. The light reflective resin portion 5 covers the side surfaces of the light emitting devices 3 and the transparent member 4. The upper surface of the transparent member 4 is exposed from the light reflective resin portion 5, and serves as a light emission surface 4a of the light emitting apparatus. Light is output through the light emission surface 4a. The light emitting apparatus 10 includes electrically conductive pattern portions 2a and 2b. Parts of electrically conductive pattern portions 2a and 2b extend from and are exposed from the light reflective resin portion 5. The exposed parts serve as external connection parts to be connected to an external power source. Current is supplied to the light emitting devices 3 and a protection element 7 through bumps 8a and 8b from the external power source.

A pair of positive/negative electrically conductive pattern portions 2a and 2b are arranged on the surface of the base member 1. The electrically conductive pattern portions 2a and 2b have through holes 6a and 6b, respectively. The base member 1 is exposed in the through holes 6a and 6b. The through holes 6a and 6b have an elongated shape extending in the extending direction of the electrically conductive pattern portions 2a and 2b, in other words, extending in the longitudinal direction of the base member 1 in this embodiment. The electrically conductive pattern portions 2a and 2b are partially covered with the light reflective resin portion 5. The light reflective resin portion 5 is in contact with the surface of the base member 1 in the through hole 6a and 6b. The protection element 7 such as Zener diode is arranged in the light reflective resin portion 5 on the base member 1. In this embodiment, each of the light emitting devices 3 and the protection element 7 has positive and negative terminals on one surface, which is the surface that is mounted onto the base member. The terminals are formed on this surface of each of the light emitting devices 3 and the protection element 7. The light emitting device 3 and the protection element 7 are so-called facedown-type elements. The light emitting devices 3 and the protection element 7 are mounted onto the electrically conductive pattern portions 2a and 2b on the base member 1 surface by the bumps 8a and 8b such as Au in a flip chip mounting manner.

1.1. Production Method

Figure 4:
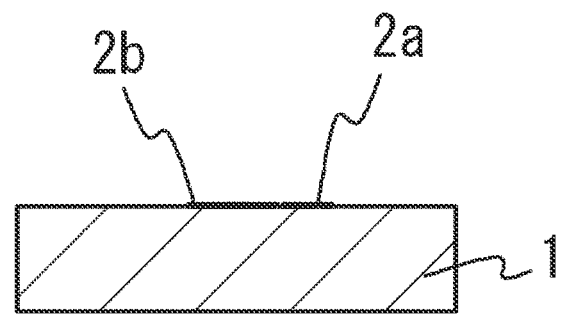
FIG. 4 is a cross-sectional view schematically showing a method for producing the light emitting apparatus according to the first embodiment.
Figure 4:
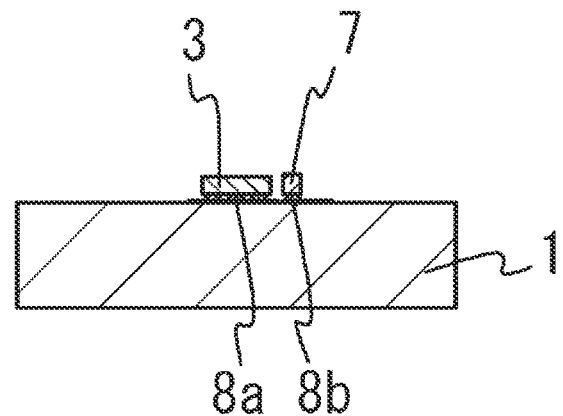
Figure 4:
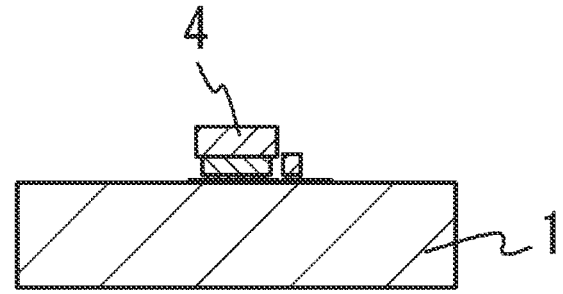
Figure 5:
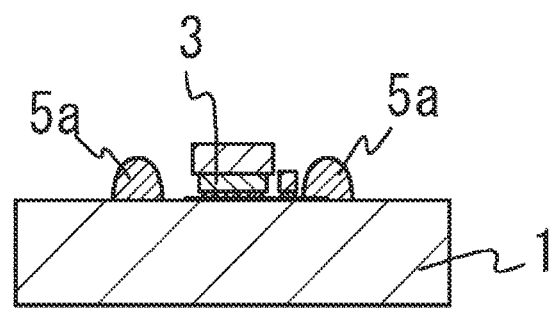
FIG. 5 is a cross-sectional view schematically showing the method for producing the light emitting apparatus according to the first embodiment.
Figure 5:
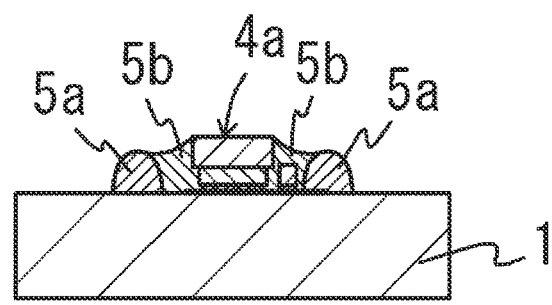
Figure 5:
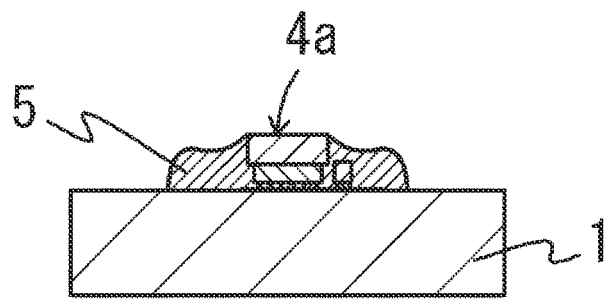
Figure 6:
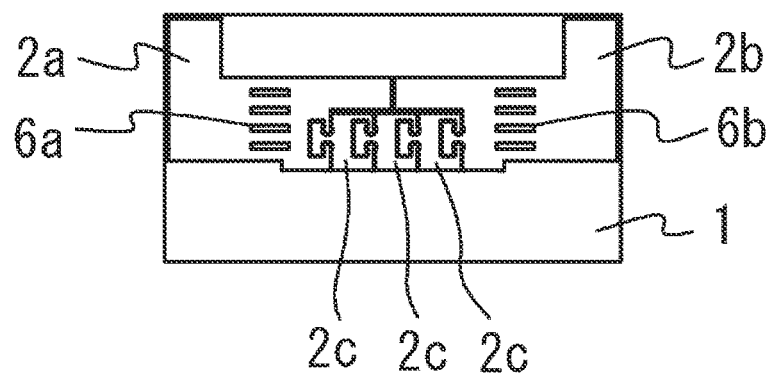
FIG. 6 is a plan view schematically showing the method for producing the light emitting apparatus according to the first embodiment.
Figure 6:
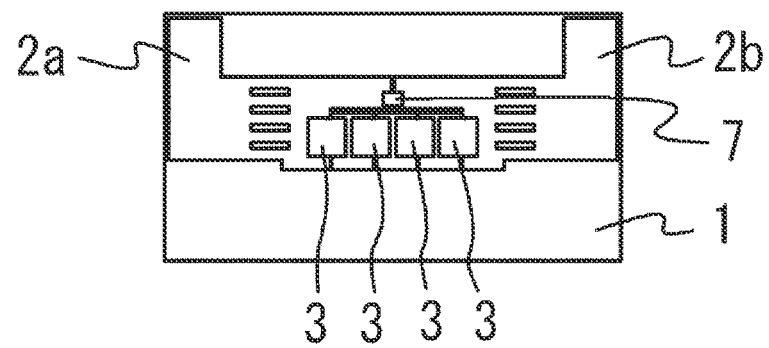
Figure 6:
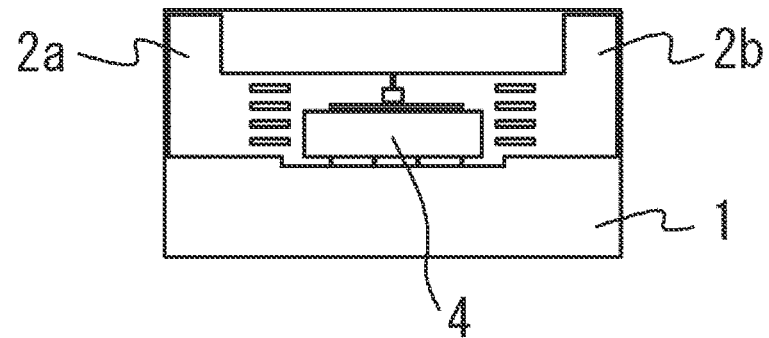
Figure 7:
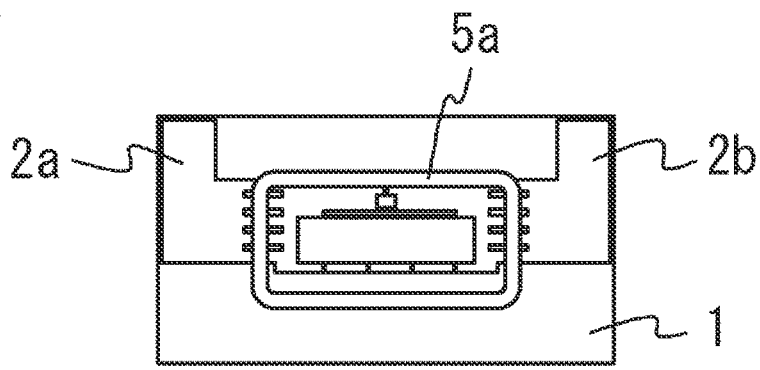
FIG. 7 is a plan view schematically showing the method for producing the light emitting apparatus according to the first embodiment.
Figure 7:
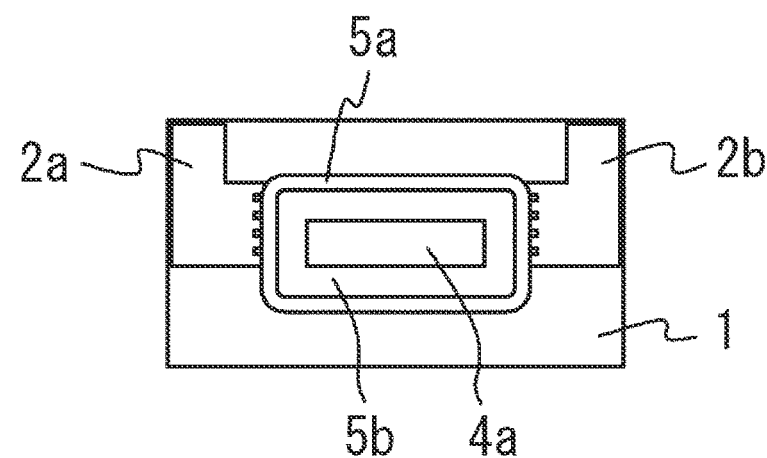
Figure 7:
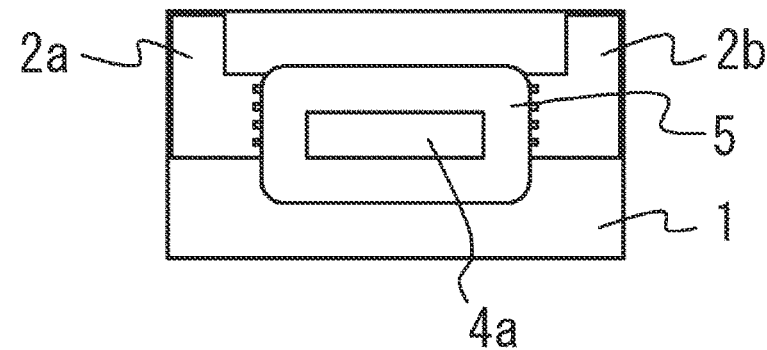

A method for producing of the light emitting apparatus 10 according to this embodiment is now described with reference to FIGS. 4 to 7. FIGS. 4 and 5 are schematic cross-sectional views showing the method for producing the light emitting apparatus according to this embodiment. FIGS. 6 and 7 are schematic plan views showing the method for producing the light emitting apparatus according to this embodiment.

As shown in FIGS. 4(a) and 6(a), the pair of positive/negative electrically conductive pattern portions 2a and 2b are first formed on the base member 1. In this embodiment, as shown in FIG. 6(a), the cathode-side electrically conductive pattern portion 2a and the anode-side electrically conductive pattern portion 2b extend from the central parts toward the periphery of the base member 1. The light emitting devices 3 are mounted to the central parts of the base member 1. The extending parts serve as external connection parts to be connected to the external power source. The width of the electrically conductive pattern portions 2a and 2b is wide. Accordingly, the current from the external power source can efficiently flow into the light emitting devices 3. The width of the electrically conductive pattern portions 2a and 2b is preferably larger than the width of the light emitting devices 3. As shown in FIG. 6(*a*), intermediate electrically conductive pattern portions 2c are arranged between the electrically conductive pattern portions 2a and 2b. Thus, the four light emitting devices mounted in a flip chip mounting manner are serially connected to each other by the intermediate electrically conductive pattern portions 2c.

Subsequently, as shown in FIGS. 4(*b*) and 6(*b*), the light emitting devices 3 and the protection element 7 are mounted to the electrically conductive pattern portions 2a and 2b by bumps 8a and 8b in a flip chip mounting manner. The four light emitting devices 3 are aligned in one row, and are serially connected to each other by the electrically conductive pattern portions 2a, 2b, and 2c, as discussed above.

Subsequently, as shown in FIGS. 4(*c*) and 6(*c*), the transparent member 4 is adhered onto the upper surfaces of the light emitting devices 3. The transparent member 4 may be secured onto the light emitting devices 3 by an adhesive (not shown). As this adhesive, it is preferable that a material be used which can effectively guide light emitted from the light emitting devices 3 toward the transparent member 4, and can optically connect the members to each other. For example, a transparent adhesive such as silicone resin may be used as this adhesive. Also, crystal jointing by thermocompression bonding or the like may be used to secure the transparent member 4 to the light emitting devices 3.

In the case where the light emitting devices 3 are thus mounted by electrically conductive members (e.g., bumps) on the electrically conductive pattern portions (metal plating portions), which is formed on the base member, in a flip chip mounting manner, it is preferable that an under-fill material (not shown) be arranged in the gaps between the light emitting installation parts of the base member and the light emitting devices. According to this construction, it is possible to absorb stress produced by the difference between the thermal expansion coefficients of the light emitting device and the base member 1, and to improve the thermal dissipation from the light emitting device. When a light reflective member, such as white resin, is used as the under-fill material, light that is emitted from the light emitting device toward the base member 1 can be reflected by the reflective member. As a result, it is possible to increase the light flux.

It is preferable that the under-fill material have lower elasticity or lower linear expansion than a second light reflective resin part 5b which is formed in the later process and covers these members. The reason is that this construction can relieve resin expansion contraction stress in the bonding part between the light emitting device and the base member, and can improve the electrical connection reliability. The under-fill material preferably has JIS-A hardness (rubber hardness) of not smaller than 10, for example. In this case, it is preferable that the second light reflective resin part 5b be a high mechanical strength material, and completely cover the under-fill material so that the under-fill material is not externally exposed. According to this construction, it is possible to ensure the durability under the external stress of the part between the light emitting device 3 and the under-fill material. In the case where the under-fill material is different from the second light reflective resin part 5b, it is preferable that the under-fill material be cured before forming the second light reflective resin part 5b. In this case, since these resin materials can be prevented from being mixed with each other, the performance of both the resin materials is not adversely affected.

Subsequently, as shown in FIGS. 5(*a*) and 7(*a*), a first light reflective resin part 5a (first resin) is formed in a frame shape which surrounds the light emitting devices 3 and the protection element 7. The first light reflective resin part 5a may be formed by a resin discharging apparatus which can continuously discharge liquid resin or discharge liquid resin in a dot shape by using air pressure, for example. The first light reflective resin part 5a is preferably formed intersecting with the through holes 6a and 6b. According to this construction, the first light reflective resin part 5a may be in contact with parts of the base member 1 which are exposed in the through holes 6a and 6b. As a result, it is possible to improve the bonding strength between the first light reflective resin part 5a and the base member 1. It is preferable that the parts of the surface of the base member 1 exposed in the through hole 6a and in 6b also be in contact with resin (second light reflective resin part 5b) with which the space inside the frame of the first light reflective resin part 5a is filled. In addition, in consideration of positional deviation in production processes, it is preferable that the first light reflective resin part 5a be formed at positions in proximity to the centers of the through holes 6a and 6b or on the base member 1 periphery side relative to the centers of the through holes 6a and 6b.

The height of the first light reflective resin part 5a is preferably substantially the same as or lower than the upper surface of the transparent member 4, which serves as the light emission surface. According to this construction, when the second light reflective resin part 5b with lower viscosity is formed in the subsequent process, the second light reflective resin part 5b will rise from the first light reflective resin part so that the side surfaces of the light emitting devices 3 and the transparent member 4 may be covered with the second light reflective resin part. For this reason, it is possible suppress that the second light reflective resin part 5b rides onto the upper surface of the transparent member 4 and interferes with outgoing light. In addition, if the height of the first light reflective resin part 5a is large, the required amount of resin will increase, which in turn increase the width of the first light reflective resin part. Also, from this viewpoint, the height of the first light reflective resin part 5a is preferably substantially the same as or lower than the upper surface of the transparent member 4. For these reasons, the height of the first light reflective resin part 5a is preferably substantially the same as or lower than the light emission surface of the light emitting apparatus. In addition, the height of the first light reflective resin part 5a is set large but limited to a degree that the second reflective resin part 5b does not overflow the first light reflective resin part. Again, the second reflective resin part covers the light emitting devices 3 and the transparent member 4. The height of the first light reflective resin part 5a is preferably set not smaller than half the height from the surface of the base member 1 or the electrically conductive pattern portions 2a and 2b to the light emission surface 4a.

When the viscosity of the first light reflective resin part 5a is set high, the height can be high and an increase in the width of the first light reflective resin part can be suppressed. However, when the viscosity is too high, productivity may decrease. When the resin discharging apparatus discharges liquid resin so that the first light reflective resin part 5a is formed, the discharged resin is formed into a frame shape by bringing the starting and finish points of a line of the resin in contact with each other. In this case, if the viscosity of the resin is too high, a gap may be produced at the contact point, or a variation in the degree of contact may arise. The viscosity of the first light reflective resin part 5*a* is set such that the first light reflective resin part has substantially a semicircular shape in cross-section and bottom expansion on the base member 1 due to its wettability, as shown in FIG. 5(*a*), for example.

Before the first light reflective resin part 5*a* is cured, as shown in FIGS. 5(*b*) and 7(*b*), the space enclosed by the frame of the first light reflective resin part 5*a* is filled with the second light reflective resin part 5*b* (second resin) with lower viscosity than the first light reflective resin part 5*a*. The second light reflective resin part 5*b* covers the side surfaces of the light emitting devices 3 and the transparent member 4, as shown in FIG. 5(*b*). The upper surface of the transparent member 4 is exposed from the second light reflective resin part 5*b*, and serves as the light emission surface 4*a* of the light emitting apparatus 10. In order that the second light reflective resin part 5*b* may not flow over the frame of the first light reflective resin part 5*a*, when the space is filled with the second light reflective resin part 5*b*, the lowest part of surface of the second light reflective resin part 5*b* is adjusted to a degree substantially the same as or lower than the height of the first light reflective resin part 5*a*. The filling amount of the second light reflective resin part 5*b* is adjusted to a degree that the side surfaces of the light emitting devices 3 and the transparent member 4 are substantially completely covered. Although depending on the surface states of the members and the viscosity of the second light reflective resin part 5*b*, the height of the second light reflective resin part 5*b* is set not smaller than half the height from the surface of the base member 1 or the electrically conductive pattern portions 2*a* and 2*b* to the light emission surface 4*a*, for example. In particular, in order to prevent the light leak, the thickness of the second light reflective resin part 5*b* is large on the side surfaces of the light emitting devices 3. For this reason, it is preferable that the height of the first light reflective resin part 5*a* be set higher than at least the upper surfaces of the light emitting devices 3, and that the filling amount of the second light reflective resin part 5*b* be adjusted so that the lowest part of the surface of the second light reflective resin part 5*b* is higher than the upper surfaces of the light emitting devices 3.

In addition, in order to prevent the protection element 7 from absorbing the light, the protection element 7 is completely covered with the second light reflective resin part 5*b*. It is preferable that the first and second light reflective resin parts 5*a* and 5*b* cover parts where the pair of positive and negative electrically conductive pattern portions 2*a* and 2*b* are opposed to each other, such as the parts in proximity to the light emitting devices 3 and the protection element 7. According to this construction, it is possible to prevent a short circuit caused by dust and the like which can otherwise become attached to these parts.

In order to reliably cover the side surfaces of the light emitting devices 3 and the transparent member 4, a resin material of the second light reflective resin part 5*b* may be selected to have a lower viscosity than that of the first light reflective resin part 5*a*. If only a resin with high viscosity is used as for the light reflective resin portion, such resin is less likely to rise along the side surfaces of the light emitting devices 3 or the transparent member 4. For this reason, it is difficult to completely cover the side surfaces of the light emitting devices 3 or the transparent member 4. On the other hand, if only resin with low viscosity is used, the bottom of this resin can expand too much, requiring the light emitting apparatus to be too large. Also, if a resin stopper is used to prevent this expansion of the resin, the resin can be peeled off of the base member when the resin stopper is removed. To prevent these problems, resin with high viscosity may be used as the first light reflective resin part 5*a*, while resin with low viscosity may be used as the second light reflective resin part 5*b*. Since the first light reflective resin part 5*a* is formed from resin with higher viscosity than the second light reflective resin part 5*b*, even before the resin is cured, the resin of the first light reflective resin part can serve as a stopper which stops the second light reflective resin part 5*b* with low viscosity. The viscosity of the resin parts can be adjusted by the viscosity of the base material of the resin, for example. In this case, the first and second light reflective resin parts 5*a* and 5*b* may include the same filler in their base materials.

After the space inside the frame is filled with the second light reflective resin part 5*b*, as shown in FIGS. 5(*c*) and 7(*c*), the first and second light reflective resin parts 5*a* and 5*b* are cured so that the light reflective resin portion 5 is formed. Since the first and second light reflective resin parts 5*a* and 5*b* are adhered onto the base member 1 as discussed above, the first and second light reflective resin parts may be cured in one process. Although the first and second light reflective resin parts are preferably cured at the same time, the first and second light reflective resin parts may be cured using different curing start timing and different curing finish timing. In this case, an interface surface will not be formed between the first and second light reflective resin parts. As a result, the first and second light reflective resin parts may be integral. According to this construction, the bonding strength can be improved between the first and second light reflective resin parts. As a result, the first and second light reflective resin parts can be prevented from being peeled off the base member. Therefore, it is possible to manufacture a light emitting apparatus with improved reliability. In order to allow the first and second light reflective resin parts 5*a* and 5*b* to be cured using the same conditions, the first and second light reflective resin parts 5*a* and 5*b* are preferably formed from base materials which have substantially the same curing conditions.

The following description will describe the members and the structure of the light emitting apparatus 10 according to this embodiment.

1.2. Base Member

Examples of the base member 1 are provided by plate members formed of electrically insulating materials such as glass epoxy, resin and ceramics. Also, the base member may be a metal member in which an insulating member is formed, or an insulating member in which a metal member is formed. The base member 1 is preferably formed of a flat plate member. The reason is that the space inside the frame of the first light reflective resin part 5*a* is filled with the second light reflective resin part 5*b* and additionally with other resin. In addition, the base member is preferably formed of a material on the surface of which electrically conductor wiring (electrically conductive pattern portions) for connection to the light emitting devices 3 is formed. Examples of materials that may be used in the base member include ceramics with high heat resistance and high weather resistance, such as alumina, aluminum nitride, mullite and the like. Also, from the viewpoint of bonding strength between the base member and the light reflective resin portion 5, a ceramic material is preferably used for the base member. That is, the base member is preferably formed of a ceramic plate member. Ceramic materials have higher bonding strength with the light reflective resin portion 5 as compared with the electrically conductive pattern portions formed of a metal material. In addition, there is a smaller thermal expansion coefficient difference between ceramic materials and the light reflective resin portion 5 as compared with the electrically conductive pattern portions. As a result, it is possible to relieve the thermal stress caused by thermal expansion. According to this construction, the airtightness of the light emitting apparatus can be improved. As a result, it is possible to prevent the light reflective resin from being peeled off by thermal stress caused by temperature variations. Therefore, the reliability of the light emitting apparatus can be improved. Also, in order to properly dissipate heat from the light emitting devices 3, it is preferable that the thermal conductivity of the base member 1 be not less than 150 W/m K. The base member may include multiple layers. For example, the base member may be formed of a ceramic plate member with an additional layer disposed over the ceramic plate member.

Although four light emitting devices 3 are mounted on the base member 1 in this embodiment, the number of the installed light emitting devices may be adjusted depending on the required size and brightness of the light emitting apparatus.

1.3. Electrically Conductive Pattern Portions

The pair of positive/negative electrically conductive pattern portions 2a and 2b are formed on the base member 1. The electrically conductive pattern portions 2a and 2b extend from a resin-covered part toward the periphery of the base member 1. The resin-covered part is covered with the light reflective resin portion 5 (resin). The width of the electrically conductive pattern portions 2a and 2b is wide. Accordingly, the current from the external power source can efficiently flow into the light emitting devices 3. The width of the electrically conductive pattern portions 2a and 2b is preferably larger than the width of the light emitting devices 3. The material of the electrically conductive pattern portions 2a and 2b is selected such that it can be formed on the surface of the base member 1, and serves as positive and negative terminals of the light emitting apparatus. For example, Au may be used as the material of the electrically conductive pattern portions. The electrically conductive pattern portions 2a and 2b may be formed by electrolysis plating, electroless plating, vapor deposition, sputtering, or the like. The electrically conductive pattern portions 2a and 2b according to this embodiment extend from the resin-covered part toward the periphery of the base member 1. The resin-covered part is covered with the light reflection resin portion 5. After reaching substantially the periphery of the base member 1, the electrically conductive pattern portions turn and continuously extend along the periphery of the base member 1. According to this construction, the area of the external connection parts to be connected to the external power source can be large. Therefore, it is possible to provide a light emitting apparatus which can be easily connected to the external power source. In addition, when external light is incident on the metal material used for the electrically conductive pattern portions 2a and 2b, the external light will be reflected at high reflection ratio by the metal. For this reason, as shown in FIG. 2, it is preferable that the lower edges (as viewed in FIG. 2) of exposed parts of the electrically conductive pattern portions 2a and 2b are substantially aligned with the lower edge (as viewed in FIG. 2) of the light emission surface 4a. The exposed parts of the electrically conductive pattern portions 2a and 2b are exposed from the light reflective resin portion 5. According to this construction, it is possible to suppress the reflection of external light on a lower-side surface of the light emission surface 4a located lower than the lower edge (as viewed in FIG. 2), and thereby provide a desired light distribution pattern.

1.4. Through Holes

The through holes 6a and 6b are formed in an elongated shape in the electrically conductive pattern portions 2a and 2b, and extend in the extending direction of the electrically conductive pattern portions 2a and 2b, respectively, so that the base member 1 is exposed in the through holes 6a and 6b. The extending direction of the electrically conductive pattern portions 2a and 2b is a direction extending from the resin-covered part toward the periphery of the base member 1. Again, in the resin-covered part, the electrically conductive pattern portions 2a and 2b are covered with the light reflective resin portion 5. In this embodiment, the extending direction of the electrically conductive pattern portions corresponds with the longitudinal direction of the base member 1. The through holes 6a and 6b may be formed by arranging a predetermined mask pattern portion when the electrically conductive pattern portions 2a and 2b are formed, for example. The through holes 6a and 6b are arranged at the positions to be covered at least with the light reflective resin portion 5. As a result, the base member 1 and the light reflective resin portion 5 are in contact with each other in the through holes 6a and 6b. The through holes 6a and 6b are formed at positions on which the first light reflective resin part 5a is formed, preferably, at positions on which both the first and second light reflective resin parts 5a and 5b are formed. In the case where the members are arranged so that each of the through holes 6a and 6b is covered with both the first and second light reflective resin parts 5a and 5b as discussed above, it is possible to improve the bonding strength between the base member 1, and the first and second light reflective resin parts 5a and 5b. Therefore, it is possible to suppress that the first and second light reflective resin parts 5a and 5b are peeled off from the base member 1.

The light reflective resin portion 5 has a bonding strength with the base member 1 (in particular, resin and ceramics) higher than with the electrically conductive pattern portions 2a and 2b (metal). For this reason, since the surface of the base member 1 is partially exposed in the through holes 6a and 6b, it is possible to improve the bonding strength between the base member 1 and the light reflective resin portion 5. Therefore, it is possible to suppress that the light reflective resin portion 5 is peeled off from the base member 1. In addition, since the through holes 6a and 6b have an elongated shape extending in the extending direction of the electrically conductive pattern portions, it is possible to suppress an increase in resistance for current which flows through the electrically conductive pattern portions 2a and 2b, and to increase the bonding area between the light reflective resin portion 5 and the base member. Also, since the thus-constructed through holes 6a and 6b are formed, it is possible suppress reduction of the bonding strength between the base member 1 and the light reflective resin portion 5 even when the width of the electrically conductive pattern portions 2a and 2b is large. Accordingly, the width of the electrically conductive pattern portions 2a and 2b can be large. As a result, the current can smoothly flow through the electrically conductive pattern portions 2a and 2b. Therefore, it is possible to provide a light emitting apparatus with low electrical resistance.

The through holes 6a and 6b preferably have an elongated shape which extends substantially in parallel to the extending direction of the electrically conductive pattern portions 2a and 2b. The through holes 6a and 6b more preferably have a substantially rectangular shape, the longitudinal direction of which extends in the extending direction of the electrically conductive pattern portions 2a and 2b, as shown in FIG. 2. In addition, as shown in FIG. 7(a), the through holes 6a and 6b preferably have an elongated shape which extends in a direction perpendicular to the extension direction of a corresponding portion of the frame-shaped first light reflective resin part 5a. The width in the minor direction of the through holes 6a and 6b may be set to a degree that the base member 1 can be in contact with the light reflective resin portion 5 in the through holes 6a and 6b. In order to suppress increase of resistance of current which flows through the electrically conductive pattern portions 2a and 2b, the through holes 6a and 6b preferably have a narrow width. The width in the minor direction of the through holes 6a and 6b may be set smaller than the width of the light emitting devices 3, and may be set smaller than the width of the first light reflective resin part 5a. The width in the minor direction of the through holes 6a and 6b is preferably set to a value in the range about 5% to 20% the width of the electrically conductive pattern portions 2a and 2b. In the case where two or more through holes 6a or 6b are formed, the sum of the widths of the through holes 6a is set to a value not larger than half the electrically conductive pattern portion 2a, preferably to a value in the range of about 20% to 40% the electrically conductive pattern portion 2a. For example, the width of each of the through holes 6a and 6b may be greater than or equal to 0.04 mm and less than or equal to 1 mm. If more than one through hole 6a or 6b is provided in a single electrically conductive pattern portion 2a or 2b, the sum of the widths of the through holes 6a or 6b in that electrically conductive pattern portion 2a or 2b may be less than or equal to 1 mm. The length of each of the through holes 6a and 6b may be greater than or equal to 0.3 mm and less than or equal to 2 mm. The width of the electrically conductive pattern portion 2a and 2b may be greater than or equal to 1 mm and less than or equal to 5 mm. The width of the electrically conductive pattern portion 2a and 2b is preferably greater than or equal to 1.3 mm.

In the case where two or more through holes 6a or 6b are formed, it is possible to provide a large bonding area between the base member 1 and the light reflective resin portion 5 with increase of resistance of the current being suppressed. As a result, the bonding strength can be improved between the base member 1 and the light reflective resin portion 5. It is preferable that two or more through holes 6a or 6b be spaced at the same interval away from each other. In addition, it is preferable that the number of the through holes 6a be same as the through holes 6b, and that the through holes 6a and 6b be formed in the pair of positive/negative electrically conductive pattern portions 2a and 2b, respectively. For example, in this embodiment, as shown in FIG. 6(a), four through holes 6a or 6b are formed in each of the positive and negative electrically conductive pattern portions 2a and 2b.

1.5. Light Emitting Device

Light emitting diodes are preferably used as the light emitting devices 3. Light emitting diodes with any wavelength may be used as the light emitting device. For example, light emitting diodes having ZnSe, nitride group semiconductor ($In_xAl_yGa_{1-x-y}N$, where 0≤x, 0≤y, x+y≤1) and GaP may be used as blue or green light emitting devices. Also, GaAlAs, AlInGaP and the like may be used as red light emitting devices. Semiconductor light emitting devices may also be used which are formed of materials other than these materials. The composition, light color, size, number and the like of the light emitting devices to be used may be suitably selected depending on the purpose. When the light emitting apparatus includes a phosphor, a suitable example of the light emitting device is a nitride semiconductor ($In_xAl_yGa_{1-x-y}N$, where 0≤x, 0≤y, x+y≤1) which can emit light with short wavelength capable of efficiently exciting the phosphor. Various light wavelengths can be provided by selecting materials and mixed crystal ratios of the semiconductor layer of the light emitting device. In the case where the protection element 7 is provided, since the transparent member 4 is provided, the light emission surface 4a may be arranged higher than the upper surface of the protection element 7. Accordingly, the protection element 7 may be completely embedded in the light reflective resin portion 5. As a result, it is possible to prevent light absorption by the protection element 7.

The light emitting device 3 according to this first embodiment includes pair of positive and negative electrodes on one surface of the light emitting device. The pair of electrodes are connected to the electrically conductive pattern portions 2a and 2b of the base member 1 by the bumps 8a in a flip chip mounting manner. The lower surface and the upper surface of the light emitting device mainly serve as light output surfaces of the light emitting device. The electrodes are formed on the lower surface of the light emitting device. The upper surface is opposed to the lower surface of the light emitting device. In this case, since the light emitting device 3 is electrically connected to the electrically conductive pattern portions 2a and 2b by electrically conductive members such as the bump 8a and electrically conductive paste, the connection area can be large between the light emitting device 3, and the electrically conductive pattern portions 2a and 2b as compared with face-up type light emitting devices which are connected to electrically conductive pattern portions by metal wire or the like. According to this construction, current can smoothly flow into the light emitting device 3 without an increase in resistance for the current flowing through the electrically conductive pattern portions 2a and 2b with a large width. For this reason, light emitting devices to be mounted in a flip chip mounting manner are preferably used as the light emitting devices 3. For example, face-down type light emitting devices are preferably used which have a pair of positive and negative electrodes on the electrically conductive pattern portion side.

For example, the light emitting device 3 may be a light emitting device which is formed of nitride semiconductor layers deposited on a transparent sapphire substrate for the epitaxial growth deposition. In this case, the sapphire substrate serves as the upper surface side of the light emitting device 3, and as the main light output surface. Alternatively, the epitaxial growth deposition substrate may be removed by grinding, LLO (Laser Lift Off) or the like, for example. The epitaxial growth deposition substrate is not limited to the sapphire substrate. Suitable substrates may be selected. The light emitting apparatus may include a single light emitting device 3 or a plurality of light emitting device 3.

1.6. Transparent Member

The transparent member 4 is formed from a material that allows light emitted from the light emitting device 3 to pass through and be output from the material. The transparent member 4 may include a light diffusion material, and a phosphor which can convert the wavelength at least a part of the light. Specifically, examples of the material are a material of phosphor single crystal or phosphor polycrystal, a material cut from a phosphor ingot of sintered compact of phosphor powder or the like, a material obtained by sintering mixture of phosphor powder and resin, glass, inorganic substance, or the like. The thickness of the transparent member 4 is not specifically limited, and may be suitably adjusted. For example, the thickness of the transparent member may be about 50 to 300 μm. The transparent member 4 is arranged on the upper surface of the light emitting devices 3. Accordingly, the distance can be large from the surface of the base member 1 or the electrically conductive pattern portions 2a and 2b to the light emission surface 4a of the light emitting apparatus as compared with the case where only the light emitting devices 3 are arranged on the surface of the base member or the electrically conductive pattern portions. Therefore, it is possible to suppress that the light reflective resin portion 5 covers the light emission surface 4a.

Phosphors may be used in the wavelength conversion member such that white range mixed light is emitted when the wavelength conversion member is used together with blue light emitting device. For example, typical examples of such phosphors are YAG (Yttrium Aluminum Garnet) group phosphors, BOS (Barium ortho-Silicate) group phosphors, and the like. In the case where the light emitting apparatus emits white light, the emitted light is adjusted to white by adjusting the content of the phosphor included in the transparent member 4. The content of the phosphor may be about 5 to 50%, for example. Although the light output efficiency can be increased as the thickness of the transparent member 4 gets smaller, the strength of the transparent member 4 decreases as the thickness of the transparent member 4 gets smaller. Also, the distance decreases from the surface of the base member 1 to the light emission surface 4a as the thickness of the transparent member 4 gets smaller. For this reason, it is preferable that the thickness of the transparent member 4 be suitably adjusted. When a red phosphor is included in an adhesive which bonds the blue light emitting devices to the transparent member 4 including the wavelength conversion member, it is possible to provide a light emitting apparatus which emit electric bulb color light in accordance with JIS Standard.

The lower surface of the transparent member 4 serves as a surface on which light from the light emitting device is incident. The upper surface (light emission surface 4a in FIG. 3) of the transparent member 4 serves as a surface from which the light from the light emitting device is output. The upper and lower surfaces of the transparent member 4 may be flat surfaces substantially in parallel to each other, flat surfaces with asperities, or curved surfaces. For example, the transparent member 4 may have a lens shape. In this case, the side surface of the lens-shaped transparent member 4 is covered with the light reflective member 5. The transparent member 4 preferably has a plate shape. The side surfaces of the plate shape are easily covered with the light reflective member 5, while the upper surface of the plate shape is less likely to be covered with the light reflective member 5.

In the case where a plurality of light emitting devices 3 are mounted, the transparent member may be secured onto each of the light emitting devices 3. Alternatively, as shown in FIG. 5(c), a single transparent member 4 may be secured onto the plurality of light emitting devices 3. Also, as in the case of a light emitting apparatus 20 according to the later-discussed second embodiment shown in FIG. 8, the transparent member may be omitted so that the upper surface of the light emitting device 3 serves as the light emission surface 3a of the light emitting apparatus.

1.7. Light Reflective Resin Portion

The light reflective resin portion 5 according to this embodiment covers the side surfaces of the light emitting devices 3 and the transparent member 4. Specifically, the first light reflective resin part 5a (first resin) is formed in a frame shape which surrounds the light emitting devices 3 and the transparent member 4. The space between the first light reflective resin part 5a, and the light emitting devices 3 and the transparent member 4 is filled with the second light reflective resin part 5b (second resin). These light reflective resin parts 5a and 5b are cured so that the light reflective resin portion 5 is formed. When the light reflective resin portion is formed, at least the upper surface (light output surface) of the light emitting device 3 is not covered with the light reflective resin portion 5 so that light can enter the transparent member 4. The light reflective resin portion 5 is formed of a material which can reflect the light from the light emitting device 3. The light from the light emitting device 3 is reflected toward the light emitting device 3 and the transparent member 4 by the interface surface between the light emitting device 3 and the light reflective resin portion 5, and by the interface surface between the transparent member 4 and the light reflective resin portion 5. Thus, light travels in the light emitting device 3 and the transparent member 4, and finally is output through the upper surface 4a of the transparent member 4.

It is preferable that the upper surface of the light reflective resin portion 5 is located lower than of the upper surface of the transparent member 4 as the light emission surface 4a of the light emitting apparatus. After being output from the light emission surface 4a, the light spreads in the transverse direction. If the upper surface of the light reflective resin portion 5 is located higher than the light emission surface 4a, the light is output from the light emission surface 4a and is then incident on the light reflective resin portion 5. Thus, the light is reflected, which in turn cause unevenness of the light distribution. For this reason, it is preferable that the side surfaces of the transparent member 4 are covered with the light reflective resin portion 5, and the height of the light reflective resin portion 5 is lower than the light emission surface 4a, such that the light can directly travel outward after being output from the transparent member 4.

The light reflective resin portion 5 may be a member which includes a base material of resin and a reflective material included in the resin. The resin may be silicone resin, denatured silicone resin, epoxy resin, denatured epoxy resin, acrylic resin, hybrid resin which includes at least one selected from the group consisting of these resins, or the like. The reflective material may be an oxide containing any of Ti, Zr, Nb, Al and Si, or be AlN, MgF or the like. Titanium oxide ($TiO_2$) is preferably used as the reflective material. It is preferable that particles with different refractive index from the base material be distributed as reflective material in the base material. The reflection amount and transparency amount vary in accordance with the content and the density of reflective material. For this reason, it is preferable that the content and the density of reflective material be suitably adjusted depending on the shape and the size of the light emitting apparatus. For example, in the case of a relatively small light emitting apparatus, the thickness of the first light reflection member is necessarily small. In this case, in order to suppress light leakage from the thin light reflection member, it is preferable that the content of the reflective material be set high. On the other hand, in production processes such as processes for applying and for forming the light reflective resin portion 5, if a high content of the reflective material causes problems, the content of the reflective material suitably is adjusted. For example, it is preferable that the content of the reflective material (particles) be set to a value not smaller than 30% by weight, and the thickness of the reflective material be dimensioned to a value not smaller than 20 μm.

It is preferable that the first light reflective resin part 5a and the second light reflective resin part 5b be formed from resin with high viscosity and resin with low viscosity, respectively. A material similar to the aforementioned light reflective resin portion 5 may be used as the material of the first light reflective resin part 5a and the second light reflective resin part 5b. The viscosity of the first light reflective resin part 5a is preferably set to a value in the range of 200 to 1200 Pa·s, more preferably a value in the range of 200 to 900 Pa·s, and most preferably to 350 to 400 Pa·s. The viscosity of the second light reflective resin part 5b is preferably set to a value not higher than 20 Pa·s, more preferably a value not smaller than 4 Pa·s, and most preferably to 4 to 8 Pa·s. In addition, the viscosity of the first light reflective resin part 5a is set to a value higher than the viscosity of the second light reflective resin part 5b by at least 200 Pa·s. For example, the viscosity difference between the first light reflective resin part 5a and the second light reflective resin part 5b is set to about 400 Pa·s. The viscosity of resin will change when the resin includes the reflective material. In the case where the first light reflective resin part 5a and the second light reflective resin part 5b include about 30% by weight of titanium oxide particles, it is preferable that resin with viscosity in the range 230 to 270 Pa·s be used as the base material of the first light reflective resin part 5a, and that resin with viscosity in the range 2.7 to 5.3 Pa·s be used as the base material of the second light reflective resin part 5b. It is preferable that the first light reflective resin part 5a and the second light reflective resin part 5b be formed from the same resin material. According to this construction, it is possible to improve the bonding strength between the first light reflective resin part 5a and the second light reflective resin part 5b. In addition, the first and second light reflective resin parts 5a and 5b may be cured using substantially the same conditions. Even if the same resin material is used, the resin material may have different viscosities. For this reason, for example, dimethylsilicone resin with high viscosity is used as the base material of the first light reflective resin part 5a, while dimethylsilicone resin with low viscosity is used as the base material of the second light reflective resin part 5b. From the viewpoint of heat-resistance, it is preferable that silicone resin be used. Although different materials may be used as fillers such as reflective materials to be included in the base material of the first light reflective resin part 5a and the second light reflective resin part 5b, it is preferable that the same material be used. For example, the first light reflective resin part 5a and the second light reflective resin part 5b may be formed from the aforementioned dimethylsilicone resin materials with different viscosities which include 30% by weight of titanium oxide particles. In stead of the thus-constructed first light reflective resin part 5a, a frame may be formed of a transparent resin material which does not include the reflective material. In this construction, the space enclosed by the frame is filled with the second light reflective resin part 5b. However, in the case where the frame is formed of the transparent first resin, the reflective material in the second light reflective resin part 5b will be diffused into the first resin. In this case, the content of the reflective material may decrease in the second light reflective resin part 5b. As a result, the reflectivity of the second light reflective resin part 5b may decrease. In order to prevent this problem, it is preferable that the frame be formed of light reflective resin (first light reflective resin 5a). In addition, in the case where the frame is formed of light reflective resin, the boundary can be easily found between the exposed parts of the electrically conductive pattern portions 2a and 2b, and the resin. Therefore, parts of the electrically conductive pattern portions 2a and 2b can be easily identified to be connected to the external power source.

2. Second Embodiment

Figure 8:
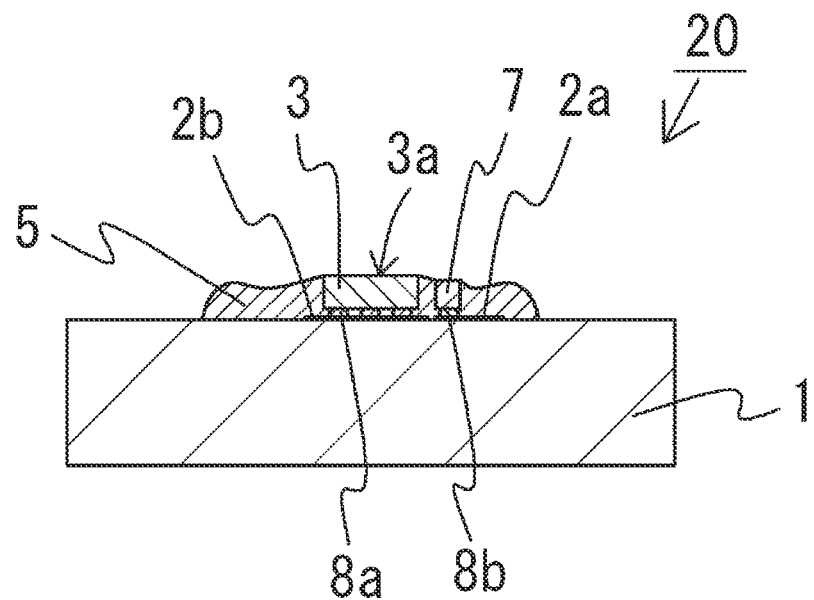
FIG. 8 is a cross-sectional view schematically showing a light emitting apparatus according to a second embodiment.

FIG. 8 is a schematic cross-sectional view showing the light emitting apparatus 20 according to the second embodiment. The light emitting apparatus 20 according to the second embodiment does not include the transparent member so that the upper surface of the light emitting device 3 serves a the light emission surface 3a of the light emitting apparatus.

A method similar to that in the first embodiment may be used for producing the light emitting apparatus 20 according to this second embodiment except that the transparent member is omitted. When the light reflective resin portion 5 is formed, it is preferable that the height of the first light reflective resin be set the same as or lower than the upper surfaces of the light emitting devices 3. The first light reflective resin is formed surrounding the light emitting devices 3. According to this construction, when the second light reflective resin part with lower viscosity is formed in the subsequent process, the second light reflective resin part 5b will rise from the first light reflective resin part so that the side surfaces of the light emitting devices 3 may be covered with the second light reflective resin part. For this reason, it is possible suppress that the second light reflective resin part rides onto the upper surface of the light emission surface 3a and interferes with outgoing light. In addition, according to this construction, the resin amount of the first light reflective resin can be reduced.

For this reason, the height of the first light reflective resin part is preferably substantially the same as or lower than the light emission surface of the light emitting apparatus. According to this construction, as shown in FIG. 8, the height of the light reflective resin portion 5 can be lower than the light emission surface 3a. In addition, the height of the first light reflective resin part is set large but limited to a degree that the second reflective resin part does not overflow the first light reflective resin part. The second reflective resin part covers side surfaces of the light emitting devices 3. The height of the first light reflective resin part 5a is preferably set to a value not smaller than half the height from the surface of the base member 1 or the electrically conductive pattern portions 2a and 2b to the light emission surface 3a.

3. Third Embodiment

Figure 9:
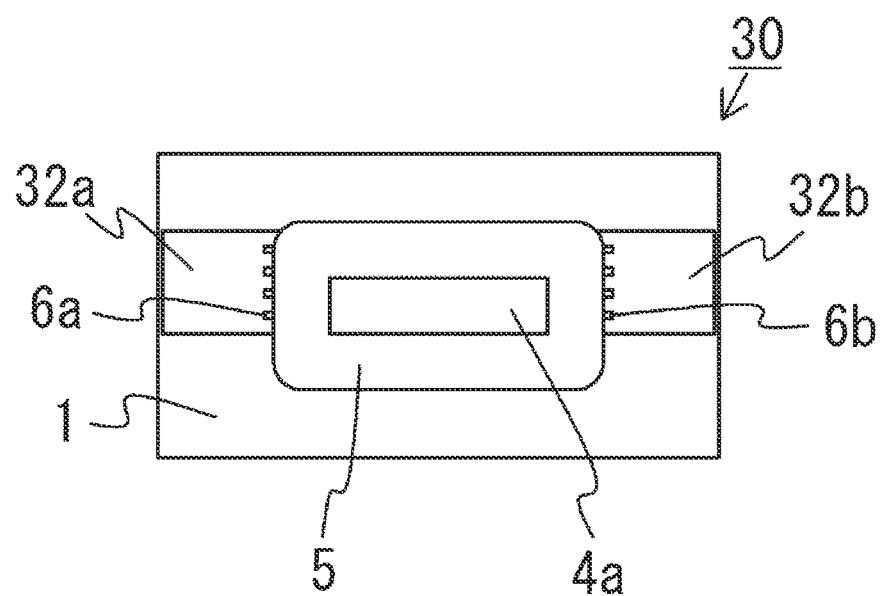
FIG. 9 is a plan view schematically showing a light emitting apparatus according to a third embodiment.

FIG. 9 is a schematic plan view showing a light emitting apparatus 30 according to a third embodiment. In the light emitting apparatus 30 according to the embodiment 3, although a pair of positive/negative electrically conductive pattern portions 32a and 32b extend from the resin-covered part toward the periphery of the base member 1, the electrically conductive pattern portions are terminated dissimilar to the light emitting apparatus 10 according to the first embodiment. The resin-covered part is covered with the light reflection resin portion 5. The pair of positive/negative electrically conductive pattern portions are only required to extend from the resin-covered part toward the periphery of the base member to at least a degree that electrically conductive pattern portions can be connected to the external power source.

4. Fourth Embodiment

Figure 10:
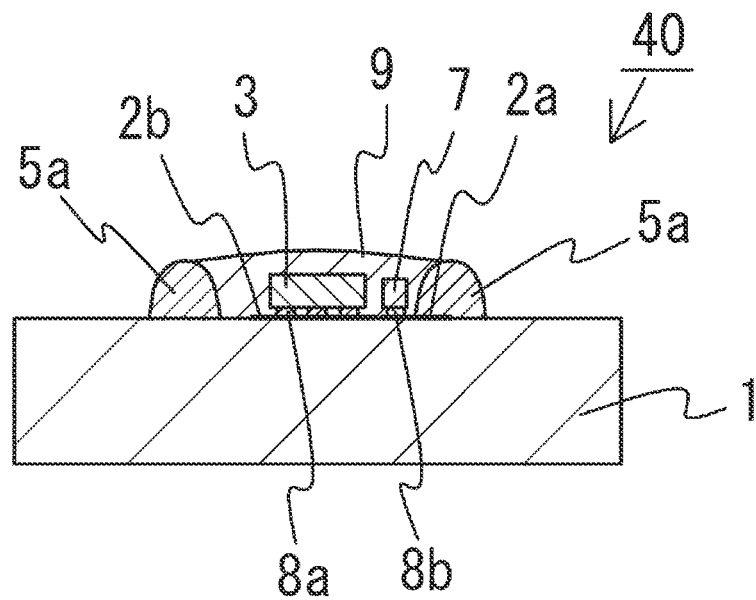
FIG. 10 is a cross-sectional view schematically showing a light emitting apparatus according to a fourth embodiment.
Figure 11:
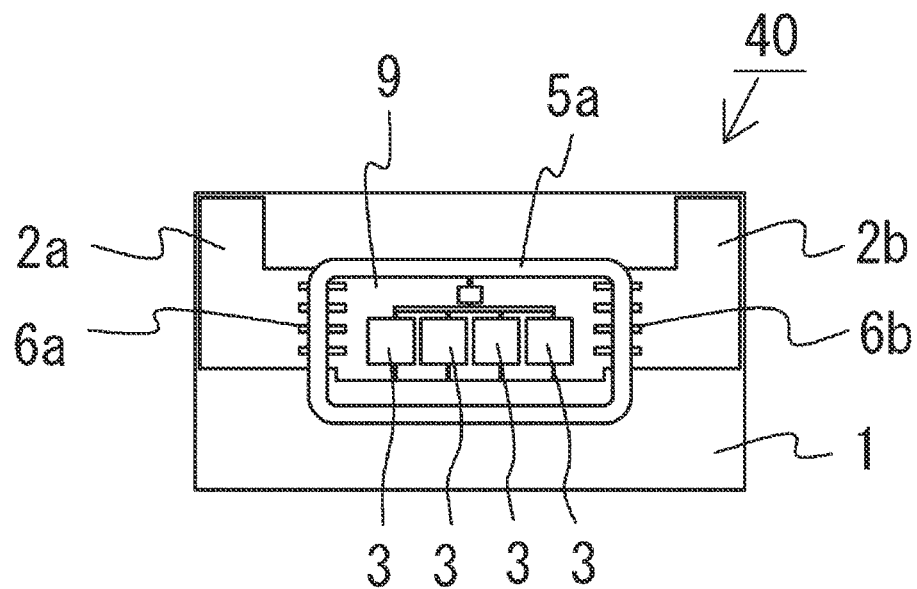
FIG. 11 is a plan view schematically showing the light emitting apparatus according to the fourth embodiment.
Figure 12:
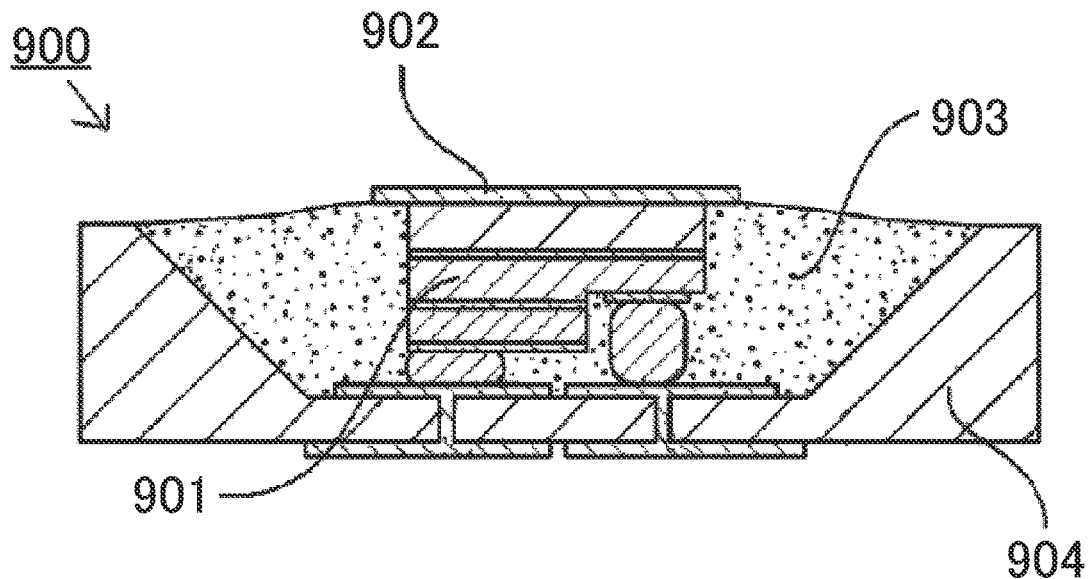
FIG. 12 is a cross-sectional view schematically showing a known light emitting apparatus.
Figure 13:
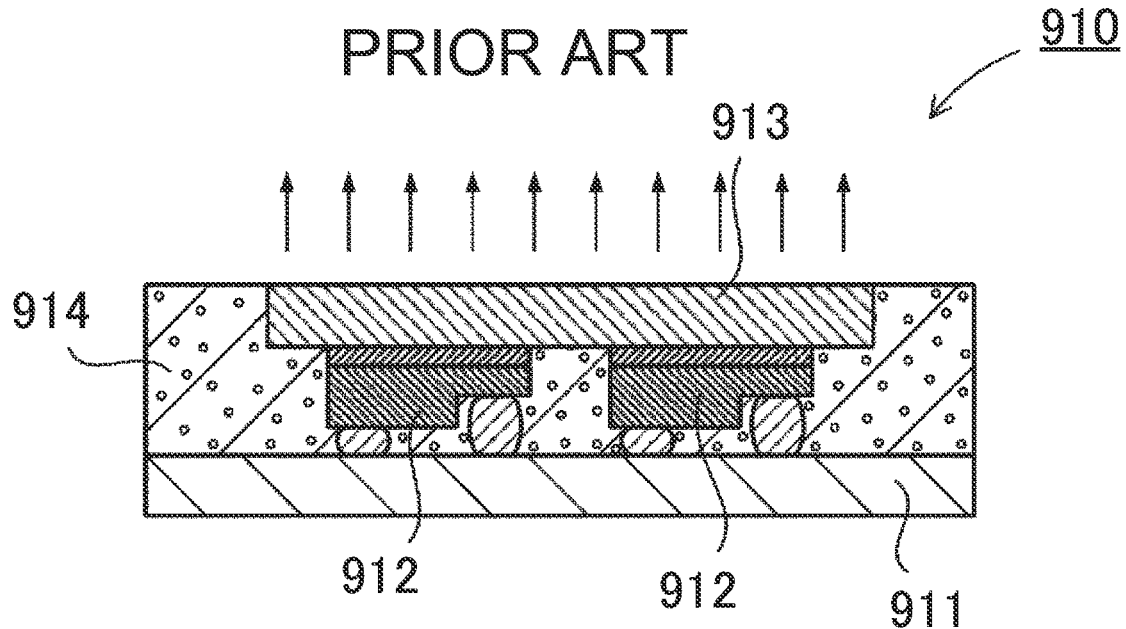
FIG. 13 is a cross-sectional view schematically showing a known light emitting apparatus.

FIGS. 10 and 11 are schematic cross-sectional and plan views showing a light emitting apparatus 40 according to a fourth embodiment. In the light emitting apparatus 40 according to the embodiment 4, the space enclosed by the frame-shaped first light reflective resin part 5a (first resin) is filled with not the second light reflective resin but transparent sealing resin 9 as the second resin.

As shown in FIG. 10, the side surfaces and the upper surfaces of the light emitting devices 3 are covered with the transparent sealing resin 9. The transparent sealing resin 9 may include a phosphor which converts the wavelength of light emitted by the light emitting devices 3. As shown in FIG. 11, it is preferable that the first light reflective resin part 5a be formed intersecting with the through holes 6a and 6b similar to the light emitting apparatus 10 according to the first embodiment. Although a similar method to the first embodiment may be used as a method for producing the light emitting apparatus 40 according to the embodiment 4, it is preferable that the space enclosed by the first light reflective resin part 5a be filled with the transparent sealing resin 9 after the first light reflective resin part 5a is cured. According to this construction, an interface surface can be distinctly formed between the first light reflective resin part 5a and the sealing resin 9. As a result, the surface of the first light reflective resin part 5a can serve as a light reflective surface which reflects light emitted from the light emitting device 3. It is preferable that the first light reflective resin part 5a and the sealing resin 9 be formed covering each of the through holes 6a and 6b, as shown in FIG. 11. According to this construction, it is possible to improve the bonding strength between the first light reflective resin part 5a and of the sealing resin 9, and the base member 1. In addition, it is possible to suppress that the first light reflective resin part 5a and of the sealing resin 9 are peeled off from the base member 1. Although the transparent resin may be used instead of the first light reflective resin part 5a, it is preferable that light reflective resin be used in order that light emitted from the light emitting devices 3 can efficiently be output and travel upward. As discussed above, in the case where the frame is formed of light reflective resin, the boundary may be easily found between the exposed parts of the electrically conductive pattern portions 2a and 2b, and the resin. Therefore, parts can be easily identified to be connected to the external power source.

5. Examples

The following description will describe a light emitting apparatus according to an example produced by a production method according to the present invention. Needless to say, the present invention is not limited to the example described below.

The light emitting apparatus according to this example shown in FIGS. 1 to 3 is produced by the method shown in FIGS. 4 to 7. Although FIGS. 1 to 7 show one light emitting apparatus, the following processes are performed on a collective plate when light emitting apparatuses are produced. The wafer is divided into a plurality of light emitting apparatuses. Thus, individual light emitting apparatuses are produced.

The base member 1 is first prepared which includes the electrically conductive pattern portions 2a, 2b, and 2c formed on the surface of the base member 1. In this example, a plate-shaped aluminum nitride plate is used as the base member 1. The base member 1 is formed by sintering an aluminums nitride plate-shaped member with about thermal conductivity of 170 W/m·K. Ti, Pt and Au layers are deposited on the base member 1 by vapor deposition in this order so that the electrically conductive pattern portions 2a, 2b, and 2c are formed to be electrically connected to the light emitting devices 3. The through holes 6a and 6b are formed in the pair of positive and negative of electrically conductive pattern portions 2a and 2b, respectively. As for the size of the base member 1, the vertical and horizontal lengths in FIG. 2 are about 6.5 mm and about 12 mm, respectively. The thickness is about 1 mm. The thickness of the electrically conductive pattern portions 2a, 2b and 2c is about 0.9 µm. The width of the part of the electrically conductive pattern portion is about 2.2 mm in which the through holes 6a or 6b is formed as shown in FIG. 6(a). The width and the length of the through holes 6a and 6b are about 0.15 mm and about 1 mm, respectively. The width of the through holes 6a and 6b is about 6.8% the width of the electrically conductive pattern portions 2a and 2b. The through holes 6a and 6b have the same size. Four through holes 6a or 6b are formed in each of the electrically conductive pattern portions 2a and 2b. Thus, a total of eight through holes 6a and 6b are formed in electrically conductive pattern portions 2a and 2b. The four through holes 6a or 6b are spaced at the same interval away from each other. The sum of the widths of the four through holes 6a is about 27% the width of the electrically conductive pattern portion 2a.

Subsequently, the light emitting devices 3 and the protection element 7 are mounted onto the base member 1. Four light emitting devices 3 are mounted onto the electrically conductive pattern portions 2a and 2b as wiring portions of the aluminum nitride plate mamber by the bumps 8a of Au in a flip chip mounting manner. The light emitting device 3 is composed of the sapphire substrate, and the semiconductor layers deposited on the sapphire substrate. The light emitting device 3 has substantially a square shape with 1 mm square. The thickness of the light emitting device 3 is about 0.11 mm. The four light emitting devices 3 are aligned in one row. The sapphire substrate serves as the light output surface. The protection element 7 is mounted onto the electrically conductive pattern portions 2a and 2b by the bumps 8a of Au in the flip chip mounting manner similar to the light emitting device 3.

Subsequently, the transparent member 4 is secured onto the upper surfaces of the light emitting devices 3. In this example, a silicone resin is used as an adhesive. The transparent member 4 and the sapphire substrates of the light emitting devices 3 are secured to each other on the bonded surfaces by thermally curing the silicone resin. The transparent member 4 according to this example is a phosphor plate of glass in which a YAG phosphor is distributed. The thickness of the transparent member 4 is about 0.18 mm. The area of the lower surface of the transparent member 4 is larger than the area of the upper surface of the light emitting device 3. The transparent member 4 has an exposed surface part which is exposed from the bonding surface after the transparent member 4 is secured onto the light emitting devices 3.

Subsequently, the first light reflective resin part 5a is formed in a frame shape which surrounds the light emitting devices 3, the transparent member 4, and the protection element 7. The first light reflective resin part 5a according to this example is formed from a dimethylsilicone resin including about 30% by weight of titanium oxide particles. The first light reflective resin 5a is discharged by the resin discharge apparatus. The height of the first light reflective resin part 5a is about 0.23 mm. The height difference is about 0.07 mm between the first light reflective resin part 5a and the light emission surface 4a the height of which is about 0.3 mm from the surface of the base member 1. The height of the first light reflective resin part 5a is about 77% the height of the light emission surface 4a from the surface of the base member 1. As for the first light reflective resin part 5a, according to the measurement by cone-plate viscometer (E-type viscometer), the viscosity of dimethylsilicone resin as a base material is about 270 Pa·s. After titanium oxide particles are included in the dimethylsilicone resin, the viscosity is about 400 Pa·s.

Subsequently, the space enclosed by the frame of the first light reflective resin part 5a is filled with the second light reflective resin part 5b so that the side surfaces of the light emitting devices 3 and the transparent member 4 are covered together with the second light reflective resin part 5b. The protection element 7 is completely embedded in the second light reflective resin part 5b. As for the second light reflective resin part 5b, according to the measurement by cone-plate viscometer (E-type viscometer), the viscosity of dimethylsilicone resin is about 4 Pa·s. About 30% by weight of titanium oxide particles is included in this dimethylsilicone resin. After the titanium oxide particles are included in the second light reflective resin part 5b, the viscosity is about 6 Pa·s.

Subsequently, the first light reflective resin part 5a and the second light reflective resin part 5b are cured. In this example, after being subjected to the aforementioned processes, the base member 1 is placed in a heating furnace. Thus, the first light reflective resin part 5a and the second light reflective resin part 5b are cured substantially at the same time. As a result, the integral light reflective resin portion 5 is provided. The total thickness of the thus-constructed light emitting apparatus 10 is about 1.3 mm, which includes the thickness of the transparent member 4 and the thickness of the light reflective member 5.

According to the thus-produced light emitting apparatus 10, since the first light reflective resin part 5a and the second light reflective resin part 5b are integrally formed, it is possible to improve the bonding strength between the first light reflective resin part 5a and the second light reflective resin part 5b. Also, it is possible to improve the bonding strength between the first light reflective resin part 5a and the second light reflective resin part 5b, and the base member. As a result, it is possible to suppress that the members are peeled off from each other. Therefore, it is possible to inexpensively produce the light emitting apparatus 10 which is improved in reliability. Also, since the through holes 6a and 6b are formed in the electrically conductive pattern portions 2a and 2b, current can smoothly flow through the electrically conductive pattern portions 2a and 2b. In addition, it is possible to suppress that the bonding strength decreases between the light reflective resin portion 5 and the base member 1.

6. Industrial Applicability

A light emitting apparatus according to the present invention can be used, for example, as a light source for general lighting, indicators, vehicles, displays, liquid crystal display back lights, signal lights, vehicle components, and channel letters for advertising signage.

It should be apparent to those with an ordinary skill in the art that while various preferred embodiments of the invention have been shown and described, the invention is not limited to the particular embodiments disclosed, which are merely illustrative of the inventive concepts and should not be interpreted as limiting the scope of the invention, and which are suitable for all modifications and changes falling within the scope of the invention as defined in the appended claims.

What is claimed is:

1. A light emitting apparatus comprising:
   an electrically insulating base member having, in a top plan view, a first edge, a second edge opposite the first edge, a third edge, and a fourth edge opposite the third edge, wherein the first and second edges of the base member extend in a first direction, and the third and fourth edges of the base member extend in a second direction;
   first and second electrically conductive pattern portions formed on an upper surface of the base member;
   at least one light emitting device that is electrically connected to the first and second electrically conductive pattern portions;
   a transparent member disposed on the at least one light emitting device; and
   a resin portion that surrounds the transparent member in the top plan view, and that partially covers the first and second electrically conductive pattern portions, wherein the resin portion has, in the top plan view, a first edge on a side corresponding the first edge of the base member, a second edge opposite the first edge, a third edge on a side corresponding to the third edge of the base member, and a fourth edge opposite the third edge, wherein the first and second edges of the resin portion extend in the first direction, and the third and fourth edges of the resin portion extend in the second direction;
   wherein, in the top plan view:
      a part of the first electrically conductive pattern portion is exposed from the resin portion, extends along the third edge of the base member, and is located between (i) the first edge of the base member, and (ii) a line along which the first edge of the resin portion extends, and
      a part of the second electrically conductive pattern portion is exposed from the resin portion, extends along the fourth edge of the base member, and is located between (i) the first edge of the base member, and (ii) the line along which the first edge of the resin portion extends.

2. The light emitting apparatus according to claim 1, wherein:
   in the top plan view, a part of the upper surface of the base member between said part of the first electrically conductive pattern portion and said part of the second electrically conductive pattern portion is exposed from the resin portion.

3. The light emitting apparatus according to claim 1, further comprising:
   a protection element mounted on and electrically connected to the first electrically conductive pattern portion and the second electrically conductive pattern portion, and covered by the resin portion.

4. The light emitting apparatus according to claim 3, wherein:
   the protection element is located between the at least one light emitting device and the first edge of the base member.

5. The light emitting apparatus according to claim 1, wherein:
   the resin portion is made of a light-reflective resin.

6. The light emitting apparatus according to claim 1, wherein:
the base member has a rectangular shape, and the first and second edges of the base member are longer than the third and fourth edges of the base member.

7. The light emitting apparatus according to claim 6, wherein:
the resin portion has a rectangular shape, and the first and second edges of the resin portion are longer than the third and fourth edges of the resin portion.

8. The light emitting apparatus according to claim 7, wherein:
the at least one light emitting device comprises a plurality of light emitting devices that are arrayed in the first direction.

9. The light emitting apparatus according to claim 8, further comprising:
a plurality of intermediate electrically conductive pattern portions located, in the top plan view, between part of the first electrically conductive pattern portion and part of the second electrically conductive pattern portion in the first direction.

10. The light emitting apparatus according to claim 9, wherein:
the plurality of light emitting devices include:
a first light emitting device mounted on and electrically connected to the first electrically conductive pattern portion and a first of the intermediate electrically conductive pattern portions, and
a second light emitting device mounted on and electrically connected to the second electrically conductive pattern portion and a second of the intermediate electrically conductive pattern portions.

11. The light emitting apparatus according to claim 10, wherein each of the plurality of light emitting devices is mounted in a flip chip manner.

12. The light emitting apparatus according to claim 1, wherein:
the transparent member comprises a phosphor.

13. The light emitting apparatus according to claim 1, wherein:
the transparent member comprises a glass including a phosphor or a compound sintered compact including a phosphor.

14. The light emitting apparatus according to claim 1, wherein:
a thickness of the transparent member is 50 μm or more and 300 μm or less.

15. The light emitting apparatus according to claim 1, wherein:
a thermal conductivity of the substrate is 150 W/m-k or more.

16. The light emitting apparatus according to claim 1, wherein an upper surface of the transparent member is a light emission surface of the light emitting apparatus.

17. The light emitting apparatus according to claim 1, wherein the transparent member includes a light diffusion material.

18. The light emitting apparatus according to claim 1, wherein the resin portion comprises:
a first light reflective resin part comprising a plurality of walls, and
a second light reflective resin part disposed in a space defined by the plurality of walls.

* * * * *